US010133986B1

(12) United States Patent
Newton et al.

(10) Patent No.: US 10,133,986 B1
(45) Date of Patent: Nov. 20, 2018

(54) QUANTUM COMPUTING WITH PHOTONIC/IONIC TUNING OF ENTANGLEMENT

(71) Applicant: The United States of America as represented by the Secretary of the Navy, Washington, DC (US)

(72) Inventors: Charles Newton, Jacksonville, FL (US); Osama Nayfeh, San Diego, CA (US); Kenneth Simonsen, San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 15/883,158

(22) Filed: Jan. 30, 2018

(51) Int. Cl.
*H01L 29/80* (2006.01)
*G06N 99/00* (2010.01)
*H03K 19/195* (2006.01)
*H01L 39/22* (2006.01)
*G06F 17/11* (2006.01)

(52) U.S. Cl.
CPC .......... *G06N 99/002* (2013.01); *G06F 17/11* (2013.01); *H01L 39/223* (2013.01); *H03K 19/195* (2013.01)

(58) Field of Classification Search
None
See application file for complete search history.

(56) References Cited

U.S. PATENT DOCUMENTS

| | | | | |
|---|---|---|---|---|
| 7,019,391 B2* | 3/2006 | Tran | ...... | G11C 13/02 257/666 |
| 7,330,369 B2* | 2/2008 | Tran | ...... | G11B 9/14 257/109 |
| 7,393,699 B2* | 7/2008 | Tran | ...... | B82Y 10/00 438/1 |
| 8,376,013 B2* | 2/2013 | Bourke, Jr. | ...... | A23L 3/26 156/349 |
| 8,742,476 B1* | 6/2014 | Or-Bach | ...... | H01L 27/0688 257/275 |
| 8,770,203 B2* | 7/2014 | Bourke, Jr. | ...... | A61K 41/008 128/898 |
| 9,296,621 B2* | 3/2016 | Feng | ...... | C01G 49/06 |
| 9,385,293 B1* | 7/2016 | Nayfeh | ...... | H01L 39/223 |
| 9,455,391 B1* | 9/2016 | Nayfeh | ...... | G06N 99/002 |
| 9,500,519 B2* | 11/2016 | Tang | ...... | G01J 1/0425 |
| 9,589,236 B1* | 3/2017 | Abdo | ...... | H05K 999/99 |
| 9,755,133 B1* | 9/2017 | Nayfeh | ...... | H01L 39/228 |
| 9,786,636 B2* | 10/2017 | Or-Bach | ...... | H01L 25/0657 |
| 9,798,219 B2* | 10/2017 | Pant | ...... | G02F 1/31 |
| 9,799,817 B2* | 10/2017 | Fong | ...... | H01L 39/223 |
| 9,833,634 B2* | 12/2017 | Bourke | ...... | A61N 5/062 |
| 9,871,034 B1* | 1/2018 | Or-Bach | ...... | H01L 27/04 |
| 9,915,733 B2* | 3/2018 | Fried | ...... | G01S 17/023 |
| 2014/0314419 A1* | 10/2014 | Paik | ...... | H04B 10/70 398/115 |
| 2018/0138987 A1* | 5/2018 | Sliwa | ...... | G06N 99/002 |
| 2018/0145110 A1* | 5/2018 | Zhao | ...... | H01L 27/18 |

* cited by examiner

*Primary Examiner* — Crystal L Hammond
(74) *Attorney, Agent, or Firm* — SPAWAR Systems Center Pacific; Kyle Eppele; Elliott Deaderick (57) ABSTRACT

A device includes a converter configured to convert photons input from a photonic link into Cooper-pairs, a first superconductor, a second superconductor, a plurality of nanowires connected to the first superconductor and the second superconductor, and a gate array connected to the plurality of nanowires and configured to alter quantum states of ions within the plurality of nanowires.

20 Claims, 10 Drawing Sheets

Physical Description of Hybrid Quantum System

QUANTUM COMPUTING WITH
PHOTONIC/IONIC TUNING OF
ENTANGLEMENT

FEDERALLY-SPONSORED RESEARCH AND DEVELOPMENT

The Quantum Computing With Photonic/Ionic Tuning Of Entanglement is assigned to the United States Government. Licensing inquiries may be directed to the Office of Research and Technical Applications, Space and Navel Warfare Systems Center Pacific, Code 72120, San Diego, Calif. 92152. Phone: (619) 553- 5118, email: ssc_pac_t2@navy.mil. Reference Navy Case No. 103743.

CROSS-REFERENCE TO RELATED APPLICATIONS

This application is related to the following issued patents: U.S. Pat. No. 9,385,293, entitled "Quantum Memory Device And Method" and issued on Jul. 5, 2016; U.S. Pat. No. 9,455,391, entitled "Advanced Process Flow For Quantum Memory Devices And Josephson Junctions With Heterogeneous Integration" and issued on Sep. 27, 2016; U.S. Pat. No. 9,755,133, entitled "Reconfigurable, Tunable Quantum Qubit Circuits With Internal, Nonvolatile Memory" and issued on Sep. 5, 2017.

BACKGROUND

Quantum memory is an emerging technology within the area of quantum computing and involves the development of a platform to store quantum superposition information in two-level systems that obey quantum mechanics and can be entangled with remotely located quantum memories to form quantum networks. Quantum memory can also be entangled with on-chip quantum bits (qubits) to form universal quantum computers. Ideally, a quantum memory should retain quantum superposition state information for as long as possible, but in current implementations the practical considerations and the physics of quantum memories and their interactions with the environment limit their efficiency and retention of such information. Advancements in the development of solid-state quantum memories are appealing because solid-state implementation can be integrated with on-chip photonics to provide a complete chip-scale platform. A need exists to develop quantum memory devices with straightforward fabrication and engineered for coupling of the quantum memory energy levels to that of the chip to superconducting qubits, which is done by the spin coupling of the MHZ-GHz hyperfine states.

SUMMARY

The present disclosure describes a device, system, and method pertaining to quantum computing with photonic/ionic tuning of entanglement. In accordance with an embodiment of the present disclosure, a device is provided that includes: a converter configured to convert photons input from a photonic link into Cooper-pairs, a first superconductor, a second superconductor, a plurality of nanowires connected to the first superconductor and the second superconductor, and a gate array connected to the plurality of nanowires and configured to alter quantum states of ions within the plurality of nanowires.

BRIEF DESCRIPTION OF THE DRAWINGS

The elements in the figures may not be drawn to scale. Some elements and/or dimensions may be enlarged or minimized, as appropriate, to provide or reduce emphasis and/or further detail.

DETAILED DESCRIPTION OF VARIOUS EMBODIMENTS

References in the present disclosure to "one embodiment" or "an embodiment" means that a particular element, feature, structure, or characteristic described in connection with the embodiments is included in at least one embodiment. The appearances of the phrases "in one embodiment," "in some embodiments," and "in other embodiments" in various places in the present disclosure are not necessarily all referring to the same embodiment or the same set of embodiments.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive "or" and not to an exclusive "or."

Additionally, use of "the," "a," or "an" are employed to describe elements and components of the embodiments herein; this is done merely for grammatical reasons and to conform to idiomatic English. This detailed description should be read to include one or at least one, and the singular also includes the plural unless it is clearly meant otherwise.

The embodiments disclosed herein describe a device, system, and method for quantum computing with photonic/ionic tuning of entanglement. A quantum memory device that is scalable, enables tuning the degree of entanglement, and has a hybrid photonic interface for on-chip, chip-to-chip, or long-range communication of quantum information may be suitable for implantation of quantum networks and quantum computers, as well as for forming a quantum internet.

A quantum memory device may include a photon-to-Cooper-pair converter, two superconducting islands, ferroelectric coated nanowires having implanted ions, and multiple gates. The photon-to-Cooper-pair converter may take input from a photonic link. Cooper pairs may move through the device in a particular direction, e.g., left to right.

A quantum memory device may be utilized for ion-based computing. Ions may be placed in the |0> or |1> states, and entanglement between adjacent ions, ions in adjacent wires, and ions in separate quantum memory devices can be achieved. Independent state configuration of the ions is also possible. The implementation of quantum algorithms may enable the ability to perform computations.

Photons of a particular wavelength (e.g., infrared to visible light, wherein visible light photons may have a wavelength between about 390 nm to about 700 nm) may be utilized to further ionize select ions in order to achieve a balance between the |0> and |1> states. The quantum memory device may allow real-time modification of the quantum state of an ion based on feedback from adjacent ions and/or computation results. Additional redundant ions can be included for error correction. Capabilities such as feedback and error correction may enhance the stability of such a device.

Redundant ions may be physically present within the device and behave the same as non-redundant ions. Computation results are the effect of operations performed on the gates and can be fed back into the device and/or output as quantum information.

Dynamic configuration and reprogramming of the gates is possible due to the feedback mechanism. Therefore, the quantum memory device can operate as a universal quantum gate, i.e., the set of gates upon which any possible operation in quantum computing can be performed. Additionally, a universal quantum gate can perform any operation possible in classical computing.

The quantum state of a single quantum bit (qubit) can be represented by a vector. Two complex numbers can be used to specify such a state. Quantum gates can behave mathematically like matrices and perform operations on the state of qubits. For example, one such quantum gate is the Pauli-X gate, which may act on a single qubit and can be the quantum equivalent of the NOT gate used in classical electrical engineering. The Pauli-X gate acting on a single qubit may switch the complex number coefficients for each possible observable state in the superposition describing the qubit.

Figure 1A:
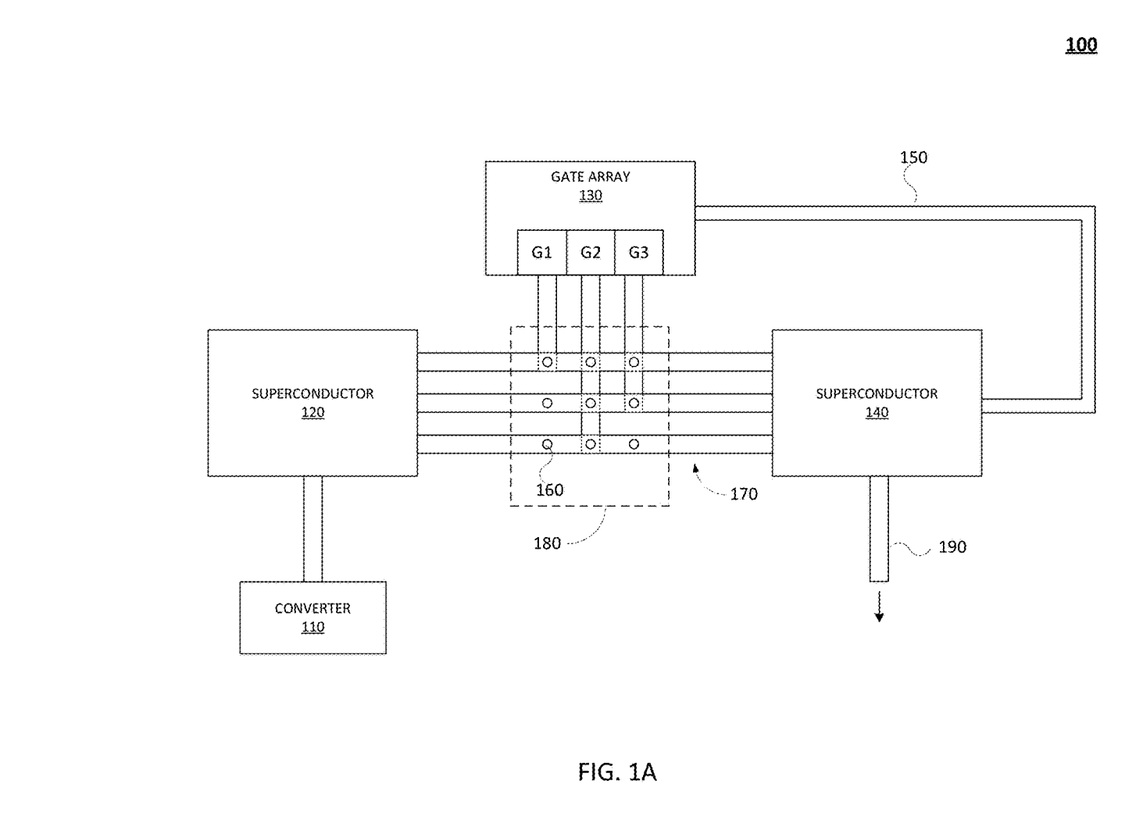
FIG. 1A is a block diagram of an embodiment of a device in accordance with the Quantum Computing With Photonic/Ionic Tuning Of Entanglement.

FIG. 1A is a block diagram of an embodiment of a device 100 that may be utilized as a quantum memory device in accordance with Quantum Computing With Photonic/Ionic Tuning Of Entanglement. Device 100 may include a converter 110 that may be configured to convert photons input from a photonic link (not shown) into Cooper-pairs. Converter 110 may be connected to a superconductor 120, which may be connected to another superconductor 140 via a plurality of nanowires 170. A gate array 130 may also be connected to the plurality of nanowires 170 and may be configured to alter the quantum states of ions 160 within the plurality of nanowires 170. The plurality of nanowires 170 may comprise Niobium (Nb) and Neodymium (Nd). In some embodiments, Nd ions may be deposited onto Nb, and other elements or compounds may be present such as Si, $AlO_x$, and/or $HfO_x$.

As shown in FIG. 1A, gate array 130 may contain a plurality of gates—G1, G2, and G3. Each gate may be connected to a specific number of nanowires in the plurality of nanowires 170 (see also FIG. 1B). In some embodiments, a gate may be connected (e.g., utilizing a gate electrode comprising Indium Tin Oxide (ITO) extending from the gate) by being in direct contact with a nanowire(s) 170, may wrap around a nanowire(s) 170, or may be in close proximity (within nanometers) with the coherence length of a nanowire(s) 170 (see also discussion of FIGS. 12-13). The specific gating configuration, along with feedback and dynamic reprogramming, allows for the gamut of possible quantum operations to be performed; therefore, the gating configuration is tied to the computational function of device 100. Gates G1, G2, and G3 may alter the states of ions 160 embedded in the plurality of nanowires 170.

The above example regarding gating configuration is not controlling; gate array 130 may contain more or less gates depending upon the configuration of device 100 and the number of nanowires used, which may be more or less than the plurality of nanowires 170 shown in FIG. 1.

Gate array 130 may be configured to alter the quantum states of ions 160 by electronically altering the polarization of ferroelectric material surrounding each nanowire in the plurality of nanowires 170. For example, electronic altering may be done by applying a voltage (such as DC voltage) or a microwave radio frequency. Examples of ferroelectric material that may be utilized include, but are not limited to, doped hafnium oxide ($HfO_2$) or other complex oxides.

In some embodiments, the multiple gates in gate array 130 may also be used to electronically and optically alter the electronic state of ions 160 (and both the electronic and optical altering may be concurrent). For example, electronically altering the electronic state of ions 160 may include causing ions 160 to respond directly to an electric field; optical altering may be performed by utilizing laser light thereby affecting the state of ions 160 with a higher energy source (see FIG. 10). Lasers may be integrated directly on-chip, while other embodiments may utilize an external laser source. Laser light may be applied directly to ions 160 in the plurality of nanowires 170 by utilizing a microscope to focus the laser light to individual/selected ions 160. Excitation of a single ion 160 or selected ions 160 via laser light may also be facilitated by on-chip waveguides or photonic structures that route the laser light to a desired location. By manipulating the polarization of the ferroelectric material and the electronic state of ions 160, the potential function for electrons moving through device 100 can be tuned.

Figure 1B:
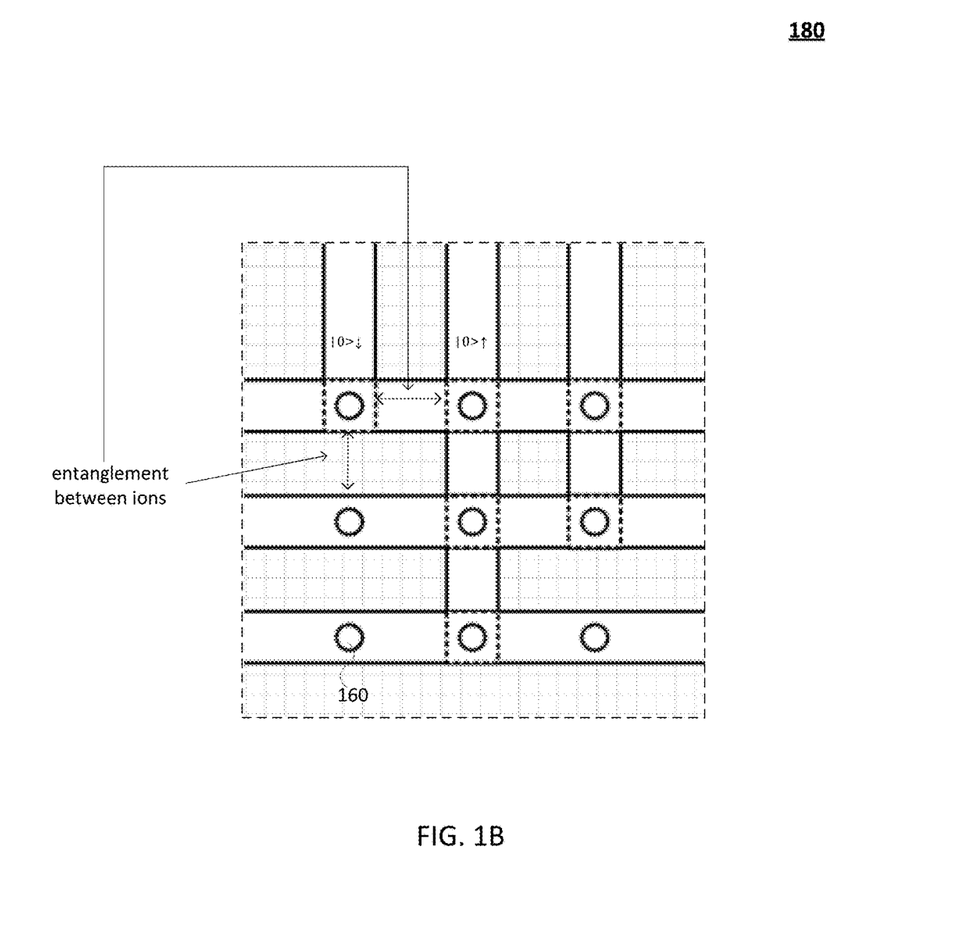
FIG. 1B shows an enlarged section of the block diagram of FIG. 1A with additional detail.

Ions 160 may be placed in the |0> or |1> states, and entanglement between adjacent ions, ions in adjacent nanowires, and ions in separate devices 100 can be achieved. FIG. 1B shows section 180 of device 100 enlarged for further detail and illustrating entanglement between adjacent ions 160, as well as ions 160 in adjacent nanowires of the plurality of nanowires 170. Such entanglement between ions 160 may be used for computational purposes or to create redundancy.

Device 100 may also include a feedback loop 150 having at least one nanowire connected between superconductor 140 and gate array 130. Feedback loop 150 may send computation results—the results of a quantum algorithm by quantum gates that may perform a task such as factoring a large number—to gate array 130 for dynamic configuration and reprogramming of gate array 130. Additionally, the computation results may be based on quantum logic operations pertaining to the configuration of the quantum states of ions 160. Computation results fed back into device 100 may initiate a new algorithm. As a result, the quantum states of ions 160 may be altered based at least in part on the computation results from feedback loop 150. Outputting the computation results as quantum information may be done via photonic quantum information channel 190 and may be output as quantum information to at least one of an entangled device, a free space network, a fiber optic network, and quantum correlation analysis equipment.

Altering the quantum states of ions 160 may tune a Hamiltonian (H), which is a tunable total-energy operator utilized within the quantum master equation:

$$\dot{\rho}(t) = -\frac{i}{\hbar}[H(t), \rho(t)] + \Sigma_n \frac{1}{2}[2C_n\rho(t)C_n^+ - \rho(t)C_n^+C_n - C_n^+C_n\rho(t)] \quad (1)$$

wherein the tuning of H is utilized to alter expectation values—the probabilistic expected values of measurements of observables. Expectation values are time-dependent.

Figure 11A:
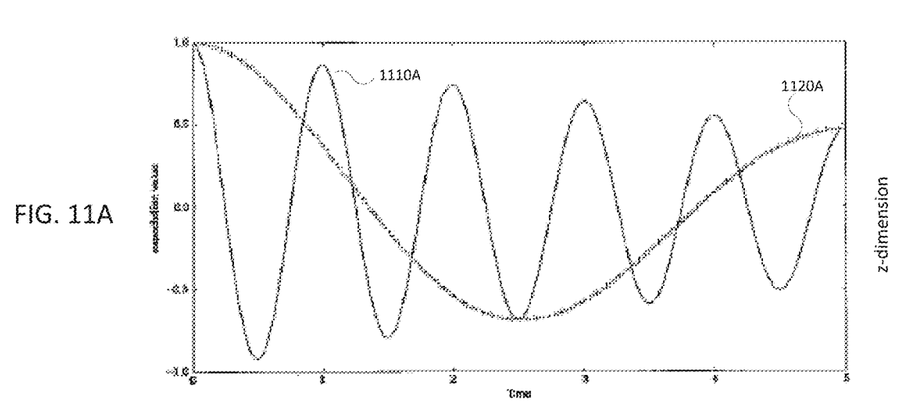
FIGS. 11A-11B are graphs showing expectation values corresponding to specific Hamiltonians for the z and y dimensions.
Figure 11B:
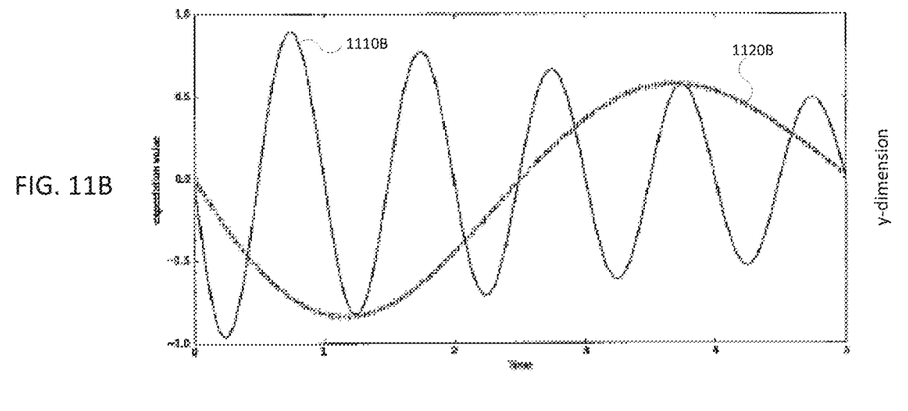

By solving Equation (1) with varied Hs, the effect on expectation values can be shown. Both the expectation value assumed and the time scale at which it fluctuates through time evolution can be manipulated using a selected H. These effects are shown in FIG. 11 as graphs of expectation values versus time for the z and y dimensions. The waves with shorter wavelengths (1110A and 1110B) in FIGS. 11A and 11B correspond to one H, while the waves with larger wavelengths (1120A and 1120B) correspond to a different H. As such, the plots in FIGS. 11A and 11B show the effect that altering an H has on the time evolution of expectation values.

Figure 2:
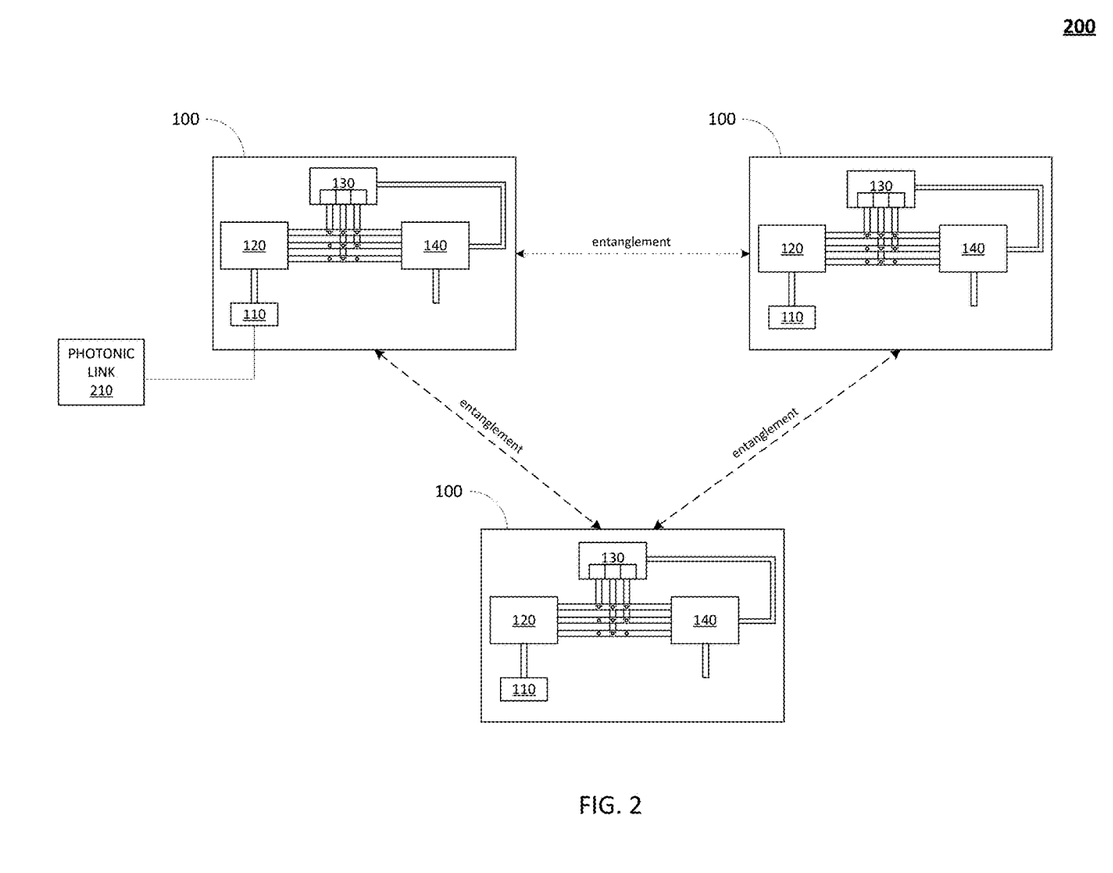
FIG. 2 is a block diagram of an embodiment of a system in accordance with the Quantum Computing With Photonic/Ionic Tuning Of Entanglement.

FIG. 2 is a block diagram of an embodiment of a system in accordance with the Quantum Computing With Photonic/Ionic Tuning Of Entanglement. System 200 may include a plurality of devices 100, each device 100 having a configuration as previously described with respect to FIG. 1. Aspects of system 200 that pertain solely to previously described device 100 will not be further described. System 200 may include a photonic link 210 that is connected to a converter 110 in one of the devices 100. Photonic link 210 may be configured to provide photons to connected converter 110. In some embodiments, multiple photonic links 210 may be present and connected to devices 100 depending on the selected configuration of system 200.

Entanglement between separate devices 100 (as shown in FIG. 2) may serve the same purposes as previously described with respect to entangled ions (i.e., computational purposes and redundancy) and may also be utilized for long-range communication and networking of the entangled devices 100. Initial entanglement may be performed via photonic links (e.g., connecting fiber-optic cable between the photonic links of separate devices 100). After initial entanglement is achieved, further communication between entangled devices 100 may not require any physical connection via cable, etc. Because of entanglement, quantum information may be sent and received between devices 100. The quantum information is based at least in part on the outputting of computation results from quantum logic operations (based on the configuration of quantum states of ions 160) performed by each device 100. The quantum information may also be sent to a free space network, a fiber optic network, and/or quantum correlation analysis equipment.

In some embodiments, device 100 and/or system 200 may be implemented in a low temperature environment (e.g., a cryomagnetic/optical probe station) that may be suitable for accessing the superconducting properties of various components (e.g., a temperature at or below about 9.3K for Nb). In other embodiments, device 100 and/or system 200 may be implemented in a room temperature environment and may utilize a higher bias voltage and unpaired electrons.

Figure 3:
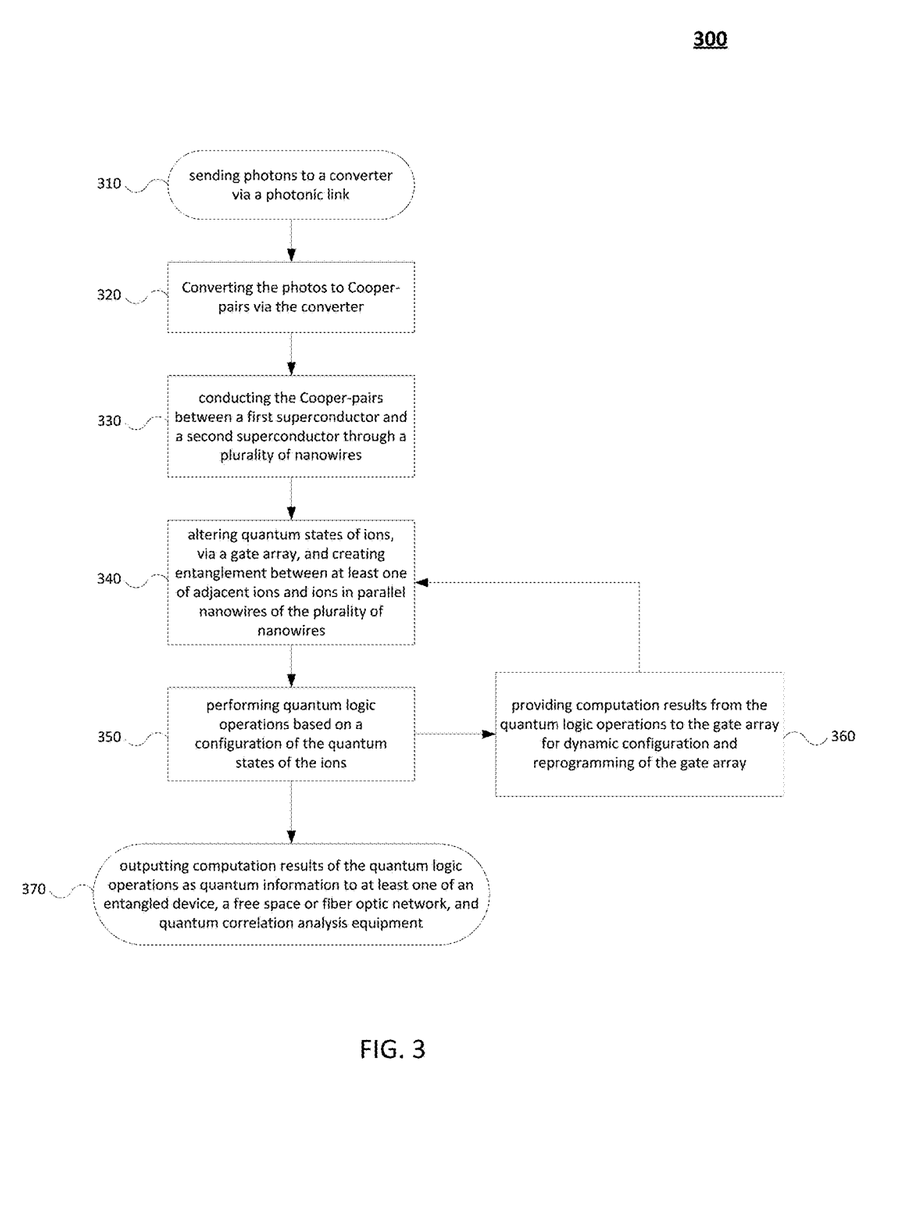
FIG. 3 is a flowchart diagram of an embodiment of a method in accordance with the Quantum Computing With Photonic/Ionic Tuning Of Entanglement.

FIG. 3 is a flowchart diagram of an embodiment of a method 300 in accordance with the Quantum Computing With Photonic/Ionic Tuning Of Entanglement. Portions of method 300 may be implemented as a series of modules, which may function in concert with physical electronic devices. Such modules may be utilized separately and/or together, locally and/or remotely to form a program product thereof.

For illustrative purposes, method 300 will be discussed with reference to the steps being performed in accordance with the device and system shown in FIGS. 1-2. Additionally, while FIG. 3 shows an embodiment of method 300, other embodiments of method 300 may contain fewer or more steps. Further, while in some embodiments the steps of method 300 may be performed as shown in FIG. 3, in other embodiments the steps may be performed in a different order, or certain steps may occur simultaneously with one or more other steps.

Method 300 begins at step 310, which includes sending photons to converter 110 via photonic link 210.

Step 320 includes converting the photons to Cooper-pairs via converter 110.

Step 330 includes conducting the Cooper-pairs between first superconductor 120 and second superconductor 140 through a plurality of nanowires 170.

Step 340 includes altering the quantum states of ions 160, via gate array 130, and creating entanglement between at least one of adjacent ions and ions in parallel nanowires of the plurality of nanowires 170. In some embodiments, the altering may include utilizing gate array 130 to alter the quantum states of ions 160 by electronically altering the polarization of ferroelectric material surrounding each nanowire in the plurality of nanowires 170. Electronic altering may be done by applying a voltage (such as DC voltage) or a microwave radio frequency.

Additionally, the altering of quantum states of ions 160 may tune H within Equation (1) as previously described, wherein the tuning of H is utilized to alter expectation values.

Step 350 includes performing quantum logic operations based on a configuration of the quantum states of ions 160.

Step 360 includes providing computation results from the quantum logic operations to gate array 130 for dynamic configuration and reprogramming of gate array 130, wherein the providing is via feedback loop 150 having at least one nanowire.

Method 300 ends at step 370, which includes outputting computation results of the quantum logic operations as quantum information to at least one of an entangled device (see FIG. 2), a free space network (which may include a form of wireless transmission such as via satellite), a fiber optic network, and quantum correlation analysis hardware/equipment. Quantum information may also be sent via waveguide, wherein an on-chip or a connected waveguide is coupled to enable direct coupling of the ion potentials.

In some embodiments, in keeping with the previous discussion of electronic and optical altering with respect to device 100, method 300 may include a step for altering the quantum states of the ions by electronically and optically altering the electronic states of the ions in each nanowire of the plurality of nanowires.

Various storage media, such as magnetic computer disks, optical disks, and electronic memories, as well as non-transitory computer-readable storage media and computer program products, can be prepared that can contain information that can direct a device, such as a microcontroller, to implement the above-described systems and/or methods. Once an appropriate device has access to the information and programs contained on the storage media, the storage media can provide the information and programs to the device, enabling the device to perform the above-described systems and/or methods.

Experimental Results

Figure 4A:
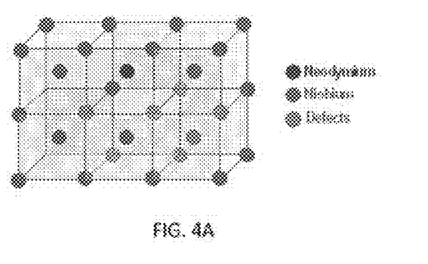
FIG. 4A illustrates a crystal lattice of Niobium (Nb) with Neodymium (Nd) ions.
Figure 4B:
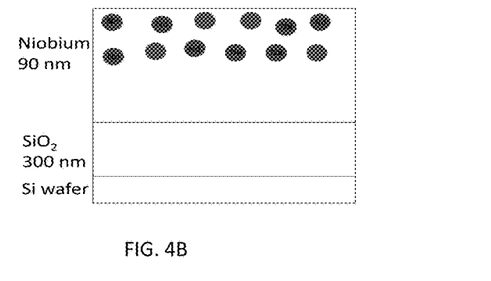
FIG. 4B illustrates a schematic of produced Nd:Nb thin film.

The starting substrates are 100 mm Si wafers with 300 nm of thermal $SiO_2$. Ninety (90) nm of Nb are DC-sputtered with a Denton Discovery sputtering system at 200 Watts in the presence of Ar. The situation is shown schematically in FIGS. 4A-4B, and the lattice situation assuming a body-centered cubic (BCC) configuration XTEM of similar samples produced by this process show a polycrystalline film with grain size of ~50 nm. FIG. 4A shows a BCC crystal lattice of Nb with Nd ions and defects. FIG. 4B shows a schematic of produced Nd:Nb thin film based on the implantation simulations; the Nd is positioned at the top 10 nm of the thin film. The wafers are diced into 5×5 mm slabs and implanted with Nd spanning 10-60 keV energies and $10^{13}$ and $10^{14}$ $cm^{-2}$ doses. The implantation conditions are selected based on ion implantation simulations with SUSPRE open source code. The energies and doses are selected in order to control the depth of the Nd concentration as and the degree of disorder to the Nb crystal caused by the implantation.

Figure 5A:
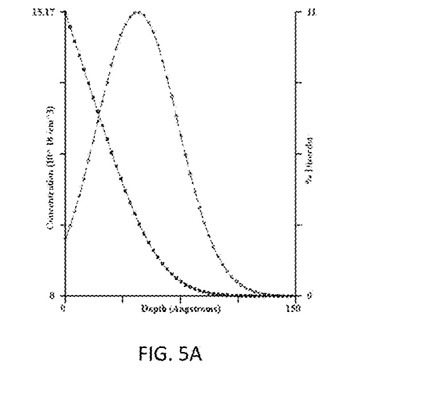
FIGS. 5A-5D are graphs showing implantation simulation results for ion implantation simulations of Nd in Nb, and showing expected distribution at energies of 10 keV and 60 keV.
Figure 5B:
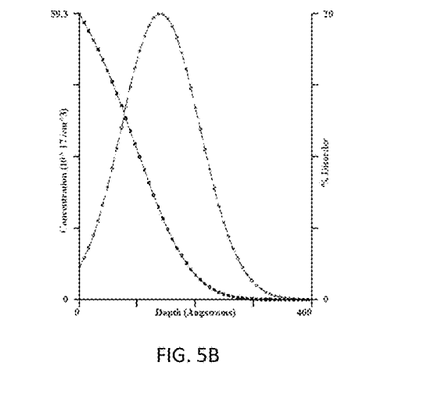
Figure 5C:
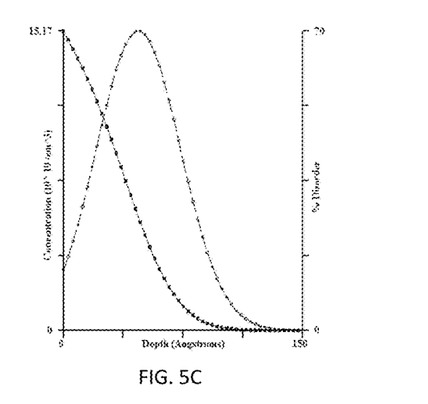
Figure 5D:
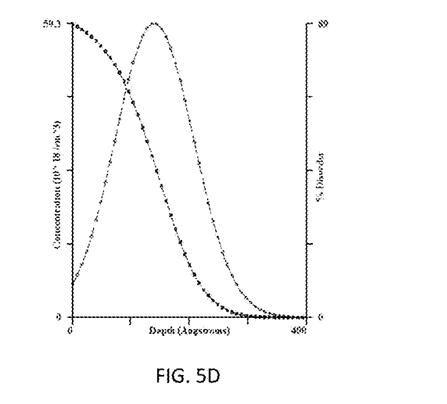

FIGS. 5A-5B show implantation simulation results with a constant dose of $10^{13}$ $cm^{-2}$ and for energies of 10 and 60 keV, respectively. FIGS. 5C-5D show the situation with increased dose to $10^{14}$ $cm^{-2}$, again at respective energies of 10 keV and 60 keV. Due to the hard nature of the Nb, the penetration depth of the Nd for 10 keV dose is near the top 5 nm of the surface and with increasing energy of 60 keV to approximately 20 nm. As the desired application is optical and the optical skin depth for NIR excitation is close to 4-5 nm this is desirable to ensure penetration of the NIR in the Nb and for capture by the embedded metallic Nd ions. With a dose of $10^{13}$ $cm^{-2}$ the degree of disorder is ~10% whereas for increased dose of $10^{14}$ $cm^{-2}$ can reach 30-40%. With a BCC configuration with 2 atoms per cell and lattice constant, the fill factor for Nd is calculated to be less than 1%.

Figure 6:
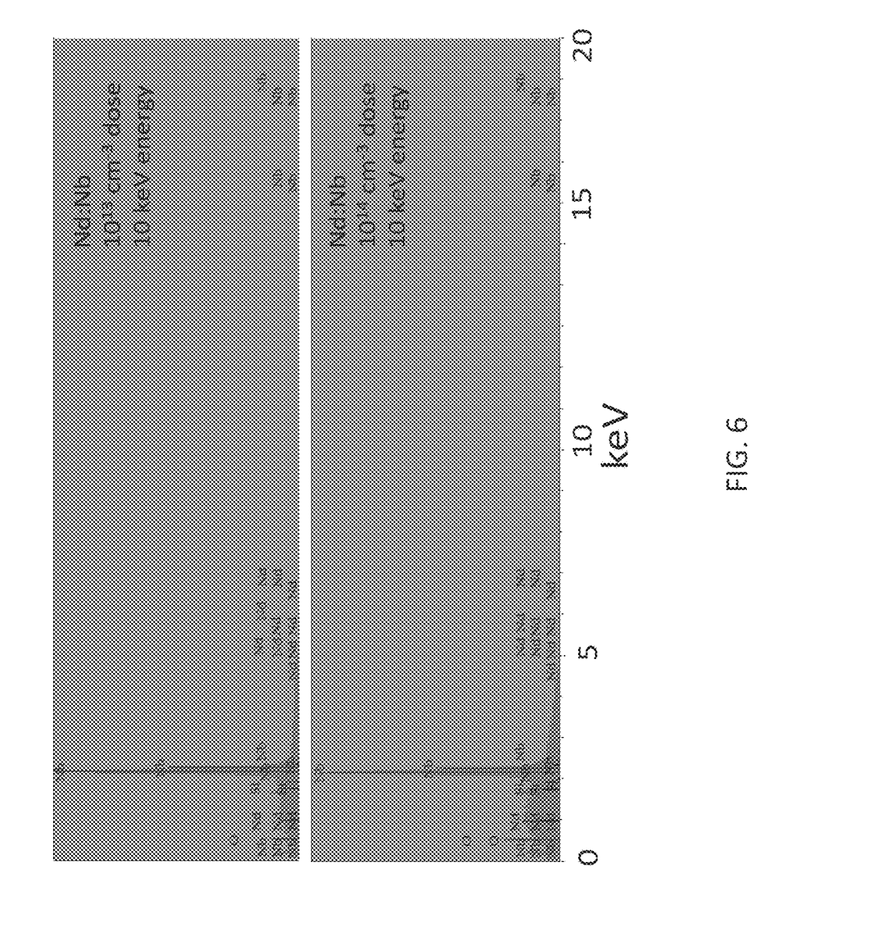
FIG. 6 is a graph showing survey scans and recognition of peaks in spectra that correspond to Nb, Nd, Si, and O.

Energy dispersive X-ray spectroscopy (EDX) is performed in an ultra-high resolution scanning electron microscope to analyze the elemental concentrations. The EDX was performed with an energy of 10 keV. FIG. 6 shows survey scans and recognition of peaks in the spectra that correspond to Nb, Nd, Si, and O. The most dominant species present is Nb, but with profoundly apparent presence of Nd according to the Lα line. The relative concentrations according to EDX are ~95% and 1.5% for Nb and Nd, respectively, consistent with the implantation simulations and the crystal analysis described. The detected Si and O is due to detection of the underlying substrate that the Nb is deposited on.

Figure 7:
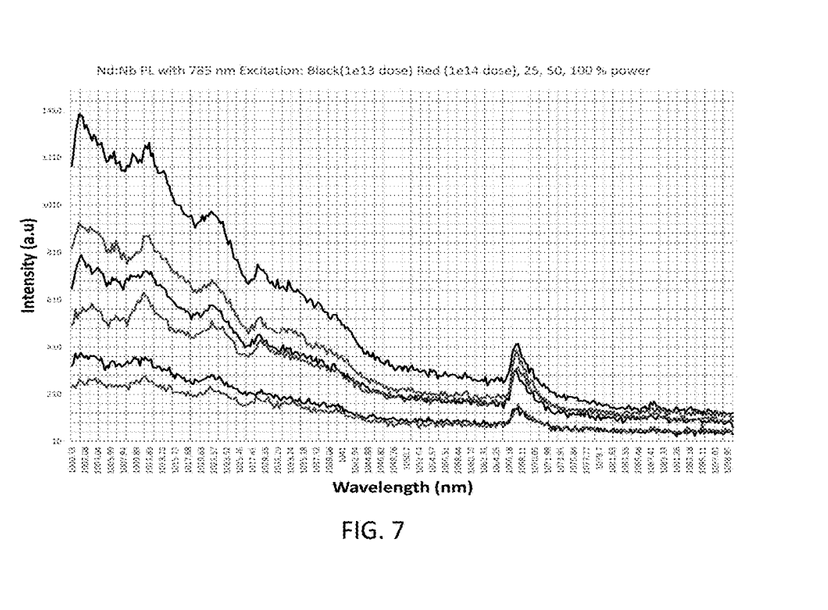
FIG. 7 is a graph showing photoluminescence spectra (un-normalized) for 10 keV Nd implant energy.
Figure 8:
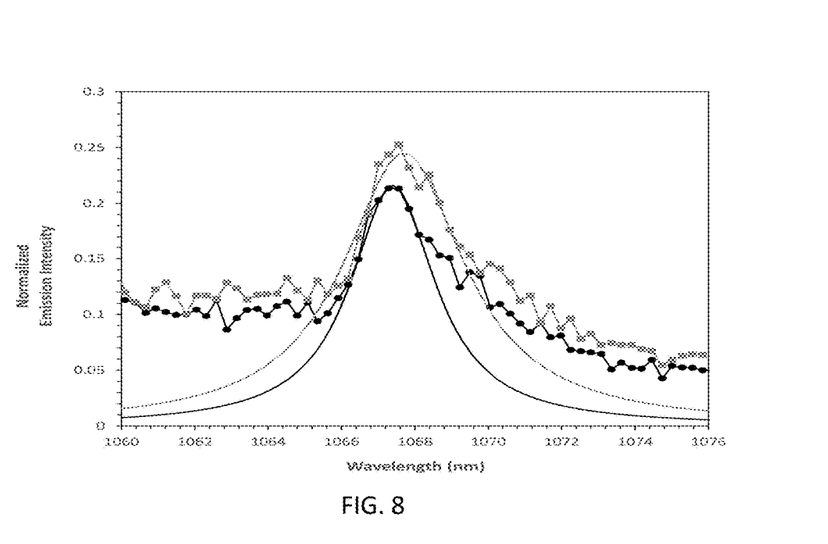
FIG. 8 is a graph showing the fitting of emission peaks for $10^{13}$ and $10^{14}$ doses with a single Lorentzian.

Scanning photoluminescence (PL) measurements were performed on Nd:Nb film (and Nb without Nd) at room temperature using an AIST-NT Confocal Raman/Atomic Force Microscopy (AFM) system with a laser excitation source of 785 nm, a Horiba iHR320 imaging spectrometer, and a Horiba Syncerity CCD camera thermoelectrically cooled to −50° C. with a Hamamatsu (S11510) near-IR image sensor. Survey scans spanning 800 to 1100 nm (FIG. 7) were first made to identify the various contributions to the PL. FIG. 7 shows photoluminescence spectra (un-normalized) for 10 keV Nd implant energy and for doses of $10^{13}$ $cm^{-2}$ and $10^{14}$ $cm^{-2}$ for 25, 50, and 100% laser excitation. In addition to some sharp peaks corresponding to the $4F_{3/2}$->$4I_{11/2}$ there is a broad band PL consistent with the formation of defects via the implantation process consistent with the description of the crystal in FIG. 4 and the ion implantation simulations. A close-up of the peaks are shown in FIG. 8 along with fittings of the peaks with single Lorentzians (emission peaks for $10^{13}$ $cm^{-2}$ and $10^{14}$ $cm^{-2}$). The deviation between the fittings can be attributed to Doppler broadening and hyperfine splitting effects. There is a 0.3 nm red shift with increased concentration of Nd, but no sign of quenching of the luminescence.

Optically detected magnetic resonance (ODMR) measurements were made in a free space arrangement at room temperature according to an experimental configuration. Laser and LED excitation were used centered at 808 nm with light focused with a 20× microscope objective. A plano-convex-lens is used to collimate PL and followed by a 976 nm long-pass filter with optical density of greater than 7. A fixed permanent magnetic was used with field intensity of 5 mT and microwave excitation was made with a coil designed by have a high Q resonance across the MHz-GHz range or a horn antenna mounted nearby to the sample. PL was carefully aligned into the fiber core of a fiber connected to a Yokogawa optical spectrum analyzer. Changes in PL (i.e., ΔAPL/PL) were monitored across the 900-1550 nm wavelength range via an oscilloscope.

Figure 9:
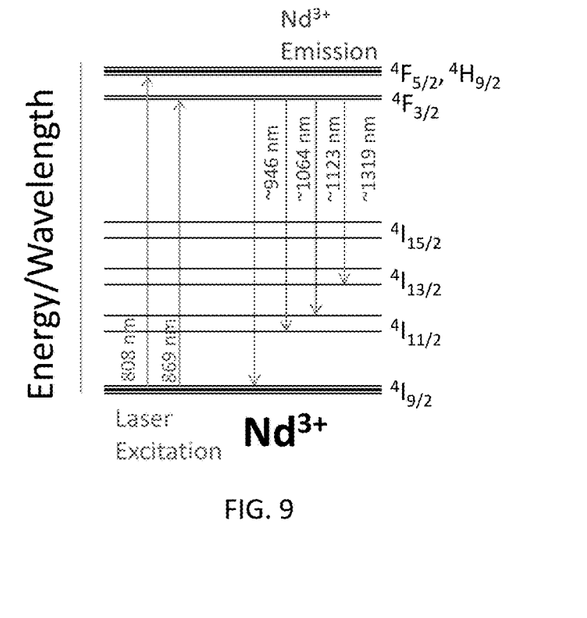
FIG. 9 is an energy-level diagram for $Nd^{3+}$ in isolation and shows the primary optical transitions.
Figure 10:
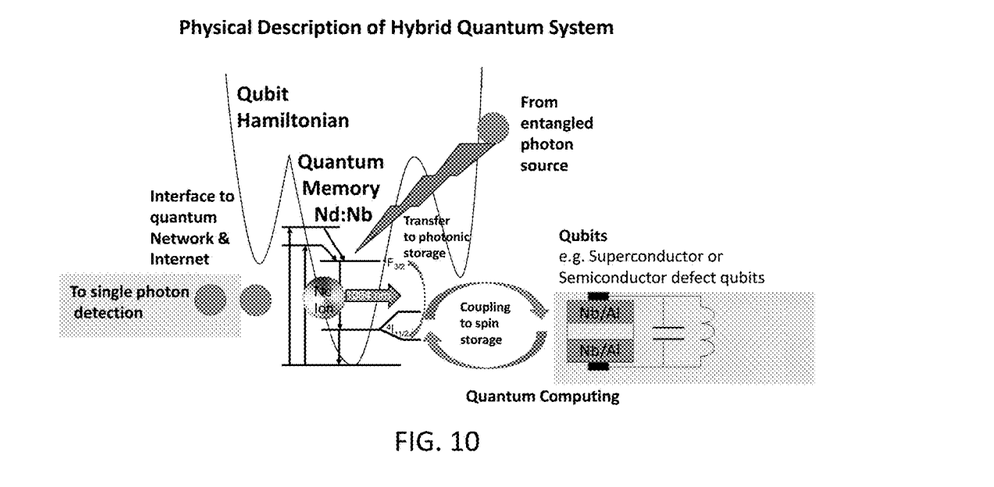
FIG. 10 illustrates a hybrid quantum system architecture with spin coupling between qubit states and the hyperfine states of the Nd:Nb quantum memory.

With both electron and nuclear spin and photon properties, Nd:Nb may be useful for integration with superconducting qubits as a quantum memory that can: 1) couple qubit states to the hyperfine MHz-GHz states of the Nd:Nb as a quantum memory for use as part of the computation process; and 2) transfer the quantum information states to the nuclear optically active long-lived states for sending of the quantum information nonlocally for enabling quantum networks, i.e., a quantum internet. This hybrid architecture is shown schematically by the energy level diagrams of $Nd^{3+}$ in FIG. 9 for the isolated state, as well as for illustrative purposes of the hybrid system architecture in FIG. 10. In FIG. 9, the energy level diagram for $Nd^{3+}$ in isolation and the primary optical transitions are shown. FIG. 10 shows an illustrative description of a hybrid quantum system architecture with spin coupling between qubit states and the hyperfine states of the Nd:Nb quantum memory and the Hamiltonian when operated in a device structure as well as transfer of spin state storage to photonic storage states for interfaces to the quantum network/internet.

Figure 12:
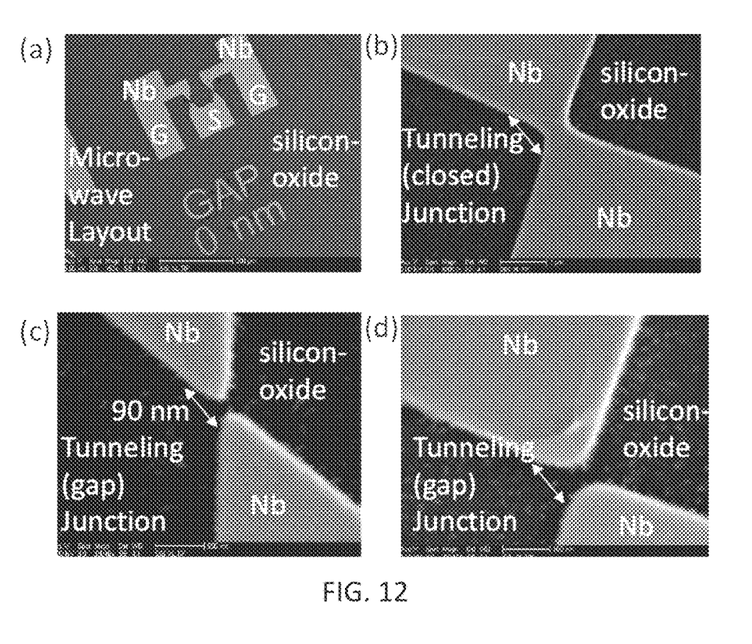
FIGS. 12-13 show scanning electron microscope images of Nb structures and tunneling junctions.

FIG. 12 shows scanning electron microscope images of Nb on $SiO_2$. Structures were produced having a closed/constricted gap at or near the coherence length for Nb. Part (a) shows a ground-signal-ground-layout; part (b) shows a closed tunneling junction region; and parts (c) and (d) show open tunneling junctions.

Figure 13:
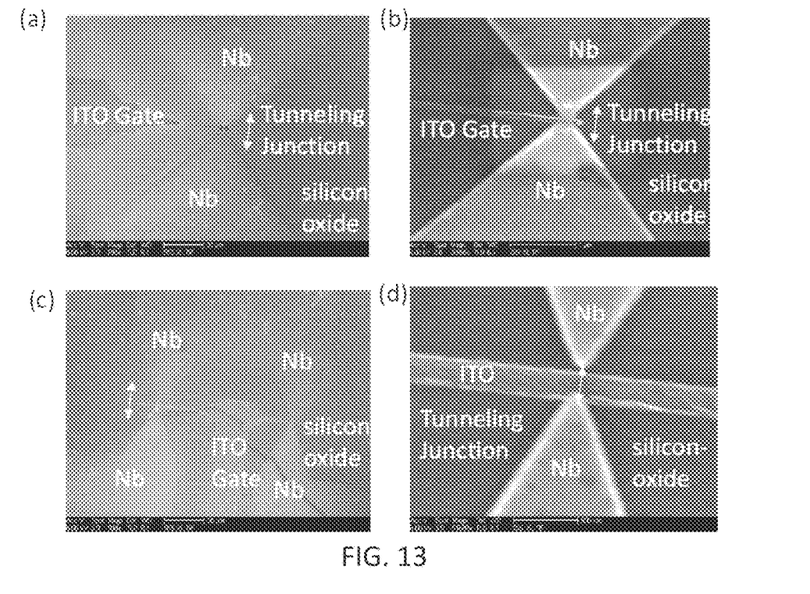

FIG. 13 shows scanning electron microscope images of structures with nanowire gate widths positioned over the tunneling junctions. Part (a) shows a gate electrode in the vicinity of the tunneling junction; part (b) shows a close up of a gate electrode over a closed-gap tunneling junction; part (c) shows a gate electrode over an open-gap tunneling junction; and part (d) shows a a gate electrode in an open-gap tunneling junction. The gate electrodes shown in FIG. 13 comprise ITO, but other materials may be utilized that are well known in the art.

From FIGS. 12-13, nanoscale processing of Nb structures is demonstrated in lateral configurations that may be suitable for operation in qubit/quantum memory devices and systems with integration of a microwave/RF layout and optically transparent nanowire gate electrodes.

The experimental results relate to, among other things, ion implantation of Nd in Nb thin films and show integrated optically active rare earth ions in Niobium thin films Nd:Nb may be viable for use in quantum memory for hybrid quantum systems. Experiments show the formation of Nd:Nb with 1-3% concentration by EDX and the PL isolating the sharp rare earth transition. Linewidths are a few nanometers with inhomogeneous broadening present at room temperature. Optically detected magnetic resonance and electron spin resonance shows both electron and nuclear spin and optical processes in Nd:Nb. A hybrid quantum system architecture may makes use of this quantum memory and leverage both spin and photon storage for both computation by coupling qubits and the quantum memory via the spin storage states, and transfer to the photonic states for quantum networks and quantum internet.

The quantum memory device can function as a quantum computer, and the state of the device can be reliably altered and subsequently held constant with sufficient coherence and fidelity to be read at a future time. The read-write capability of the quantum memory device allows it to be reused similar to a conventional electronics (e.g., a MOSFET transistor). With the appropriate selection of ions and photon wavelengths, the quantum memory device can be altered for communication purposes over long distances.

The use of any examples, or exemplary language ("e.g.," "such as," etc.), provided herein is merely intended to better illuminate and is not intended to pose a limitation on the scope of the subject matter unless otherwise claimed. No language in the present disclosure should be construed as indicating that any non-claimed element is essential.

Many modifications and variations of the Quantum Computing With Photonic/Ionic Tuning Of Entanglement are possible in light of the above description. Within the scope of the appended claims, the embodiments of the device, system, and method described herein may be practiced otherwise than as specifically described. The scope of the claims is not limited to the disclosed implementations and embodiments but extends to other implementations and embodiments as may be contemplated by those having ordinary skill in the art.

What is claimed is:

1. A device comprising:
   a converter configured to convert photons input from a photonic link into Cooper-pairs;
   a first superconductor;
   a second superconductor;
   a plurality of nanowires connected to the first superconductor and the second superconductor; and
   a gate array connected to the plurality of nanowires and configured to alter quantum states of ions within the plurality of nanowires.

2. The device of claim 1, wherein the gate array alters the quantum states of the ions by electronically altering the polarization of ferroelectric material surrounding each nanowire in the plurality of nanowires.

3. The device of claim 2, wherein the electronically altering includes applying at least one of a voltage and a microwave radio frequency.

4. The device of claim 1, wherein the gate array alters the quantum states of the ions by electronically and optically altering the electronic states of the ions in each nanowire of the plurality of nanowires.

5. The device of claim 1, further comprising a feedback loop including at least one nanowire connected to the second superconductor and the gate array, wherein the feedback loop sends computation results to the gate array for dynamic configuration and reprogramming of the gate array.

6. The device of claim 5, wherein the quantum states of the ions are altered based at least in part on the computation results from the feedback loop,
   wherein the computation results are based on quantum logic operations pertaining to the configuration of the quantum states of the ions, and
   wherein the computation results are output as quantum information to at least one of an entangled device, a free space network, a fiber optic network, and quantum correlation analysis equipment.

7. The device of claim 6, wherein altering the quantum states of the ions tunes a Hamiltonian (H), which is a tunable total-energy operator within quantum master equation:

$$\dot{\rho}(t) = -\frac{i}{\hbar}[H(t), \rho(t)] + \Sigma_n \frac{1}{2}[2C_n\rho(t)C_n^+ - \rho(t)C_n^+C_n - C_n^+C_n\rho(t)],$$

wherein the tuning of H is utilized to alter expectation values.

8. The device of claim 1, wherein the plurality of nanowires comprise Neodymium (Nd) and Niobium (Nb).

9. A system comprising:
   a plurality of devices as described in claim 1; and
   a photonic link connected to the converter of one of the devices and configured to provide photons to the converter,
   wherein the plurality of devices are entangled to form a quantum network through which quantum information is sent and received based at least in part on the outputting of computation results from quantum logic operations performed by each device.

10. The system of claim 9, wherein the gate array alters the quantum states of the ions by electronically altering the polarization of ferroelectric material surrounding each nanowire in the plurality of nanowires.

11. The system of claim 10, wherein the electronically altering includes applying at least one of a voltage and a microwave radio frequency.

12. The system of claim 9, wherein the gate array alters the quantum states of the ions by electronically and optically altering the electronic states of the ions in each nanowire of the plurality of nanowires.

13. The system of claim 9, wherein each device further comprises a feedback loop including at least one nanowire connected to the second superconductor and the gate array, wherein the feedback loop sends computation results to the gate array for error correction.

14. The system of claim 9, wherein altering the quantum states of the ions tunes a Hamiltonian (H), which is a tunable total-energy operator within quantum master equation:

$$\dot{\rho}(t) = -\frac{i}{\hbar}[H(t), \rho(t)] + \Sigma_n \frac{1}{2}[2C_n\rho(t)C_n^+ - \rho(t)C_n^+C_n - C_n^+C_n\rho(t)],$$

wherein the tuning of H is utilized to alter expectation values.

15. The system of claim 9, wherein the plurality of nanowires comprise Neodymium (Nd) and Niobium (Nb).

16. A method comprising:
sending photons to a converter via a photonic link;
converting the photons to Cooper-pairs via the converter;
conducting the Cooper-pairs between a first superconductor and a second superconductor through a plurality of nanowires;
altering quantum states of ions via a gate array, and creating entanglement between at least one of adjacent ions and ions in parallel nanowires of the plurality of nanowires;
performing quantum logic operations based on the configuration of the quantum states of the ions; and
outputting computation results of the quantum logic operations as quantum information to at least one of an entangled device, a free space network, a fiber optic network, and quantum correlation analysis equipment.

17. The method of claim 16, further comprising:
providing the computation results from the quantum logic operations to the gate array for dynamic configuration and reprogramming of the gate array, wherein the providing is via a feedback loop including at least one nanowire.

18. The method of claim 16, wherein the gate array alters the quantum states of the ions by electronically altering the polarization of ferroelectric material surrounding each nanowire in the plurality of nanowires via at least one of a voltage and a microwave radio frequency.

19. The method of claim 16, further comprising:
altering the quantum states of the ions by electronically and optically altering the electronic states of the ions in each nanowire of the plurality of nanowires.

20. The method of claim 16, wherein altering the quantum states of the ions tunes a Hamiltonian (H), which is a tunable total-energy operator within quantum master equation:

$$\dot{\rho}(t) = -\frac{i}{\hbar}[H(t), \rho(t)] + \Sigma_n \frac{1}{2}[2C_n\rho(t)C_n^+ - \rho(t)C_n^+C_n - C_n^+C_n\rho(t)],$$

wherein the tuning of H is utilized to alter expectation values.

* * * * *